(12) United States Patent
Watanabe

(10) Patent No.: US 6,229,223 B1
(45) Date of Patent: May 8, 2001

(54) FLEXIBLE PRINTED BOARD

(75) Inventor: Akira Watanabe, Tokyo (JP)

(73) Assignee: Olympus Optical Co., Ltd. (JP)

( * ) Notice: Subject to any disclaimer, the term of this patent is extended or adjusted under 35 U.S.C. 154(b) by 0 days.

(21) Appl. No.: 09/200,527

(22) Filed: Nov. 25, 1998

(30) Foreign Application Priority Data

Dec. 3, 1997 (JP) ................................................. H9-333219

(51) Int. Cl.⁷ .................................................... H01L 23/29
(52) U.S. Cl. ........................... 257/795; 257/98; 257/435; 257/789; 174/254
(58) Field of Search .............................. 257/98, 433, 435, 257/687, 659, 787, 789, 795; 174/254

(56) References Cited

U.S. PATENT DOCUMENTS

| | | | |
|---|---|---|---|
| 5,087,964 | * | 2/1992 | Hatta ...................................... 257/433 |
| 5,233,130 | * | 8/1993 | nishino ................................ 174/52.2 |
| 5,317,195 | * | 5/1994 | Ishikawa et al. ...................... 257/435 |
| 5,394,014 | * | 2/1995 | Ishikawa et al. ...................... 257/435 |
| 5,748,448 | * | 5/1998 | Hokari ................................. 257/432 |
| 5,990,565 | * | 11/1999 | Chang ................................. 257/687 |
| 6,028,773 | * | 2/2000 | Hundt ................................. 257/735 |

FOREIGN PATENT DOCUMENTS

| | | |
|---|---|---|
| 60-180132 | 9/1985 | (JP) . |
| 7-211423 | 8/1995 | (JP) . |

* cited by examiner

*Primary Examiner*—Cathy Lam
(74) *Attorney, Agent, or Firm*—Volpe and Koenig, P.C.

(57) ABSTRACT

A flexible printed board according to this invention relates to a flexible printed board on which a semiconductor element flip-chip-bonded. The flexible printed board has an element formation surface of the semiconductor element is shielded from light by a light-shielding member.

19 Claims, 2 Drawing Sheets

FLEXIBLE PRINTED BOARD

BACKGROUND OF THE INVENTION

1. Field of the Invention

The present invention relates to a flexible printed board and, more particularly, to a flexible printed board on which a semiconductor element is flip-chip-bonded.

2. Description of the Related Art

In a conventional compact device such as a camera, a flexible printed board is frequently employed to arrange various electric circuits in a compact housing. A technical means for bonding an element such as an IC by a so-called flip chip bonding method is also known.

This flip chip bonding method is a bonding method for arranging an element such as an IC on a printed board upside down. According to this method, an external electrode on the IC is subjected to a bump (projection) process to directly connect the external electrode to the pattern of the board or to connect the external electrode to the pattern through conductive particles. As a concrete example of the flip chip bonding method, a bonding method is disclosed in Japanese Examined Patent Publication No. 62-6652, Japanese Unexamined Patent Publication No. 7-211423, and the like.

A general flexible printed board is formed such that a copper foil is interposed between sheets each having a thickness of several tens $\mu$m. Since the sheet consists of an almost transparent material such as polyimide or polyester, the flexible printed board is considerably inferior to a hard printed board in light-shielding property.

When a semiconductor element such as an IC is bonded on a flexible printed board being inferior in light-shielding property by the flip-chip bonding method, the following drawbacks occur. More specifically, when such a flexible printed board is applied to a product such as a camera which is used under outside strong light or a product used to guide object light to the inside of the product, sunlight, illumination light, or leakage light from a built-in electronic flash, a date LED, or the like is incident on the surface of the semiconductor element such as an IC because the flexible printed board itself is inferior in light-shielding property as described above. As a result, in the semiconductor element, a change in performance or an erroneous operation is disadvantageously caused by a photo-electric effect.

SUMMARY OF THE INVENTION

It is a first object of the present invention to provide a flexible printed board, although a semiconductor element is flip-chip-bonded on the flexible printed board, which can shield the semiconductor element surface from external light.

It is a second object of the present invention to provide a flexible printed board, although a semiconductor element is flip-chip-bonded on the flexible printed board, which can easily prevent a change in performance, an erroneous operation, or the like caused by the photo-electric effect of an element on a semiconductor.

In short, the present invention relates to a flexible printed board on which a semiconductor element is flip-chip-bonded, and is characterized in that an element formation surface of the semiconductor element is shielded from light by a light-shielding member.

These as well as other objects and advantages of the present invention will become further apparent from the following detailed explanation.

DETAILED DESCRIPTION OF THE PREFERRED EMBODIMENTS

Embodiments of the present invention will be described below with reference to the accompanying drawings.

Figure 1:
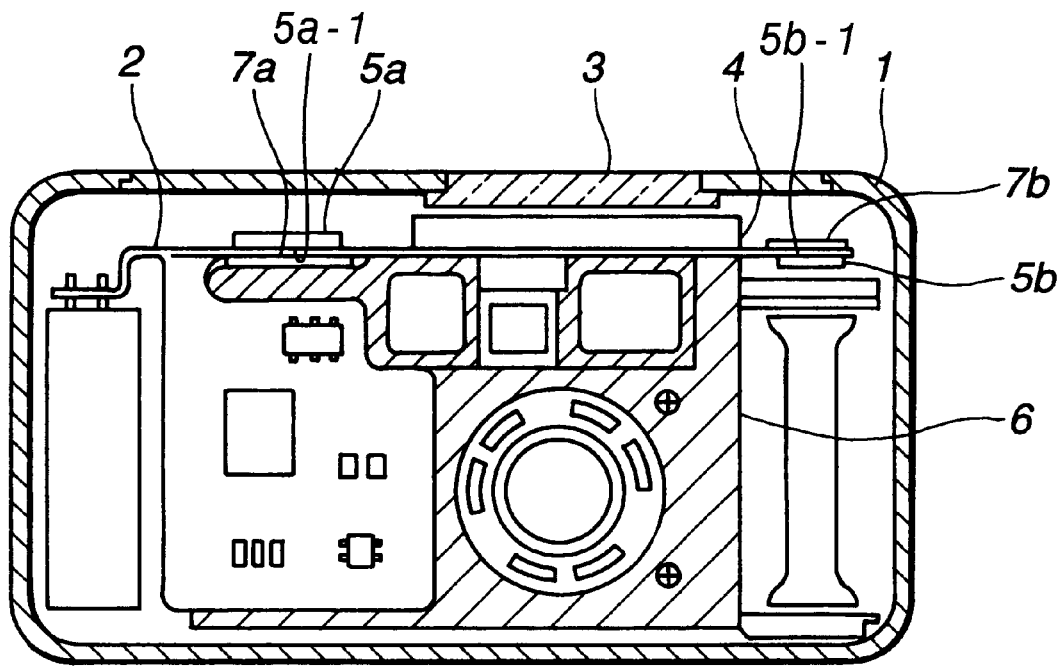
FIG. 1 is a sectional view showing the front surface of a camera having a flexible printed board according to a first embodiment of the present invention wherein the outer member of the camera is partially cut away.

FIG. 1 is a sectional view showing the front surface of a camera having a flexible printed board according to the first embodiment of the present invention when the outer member of the camera is partially cut away.

As shown in FIG. 1, in the camera according to this embodiment, an LCD window 3 for an LCD display is arranged on the upper surface of an outer member 1, and an LCD 4 bonded on a flexible printed board 2 is arranged in the camera to oppose the LCD window 3. The LCD 4 performs a display operation according to a predetermined signal from the flexible printed board 2.

The flexible printed board 2 is arranged along the body surface throughout a plurality of surfaces on a camera body 6, and predetermined electronic circuit parts are bonded on the surface of the flexible printed board 2. Semiconductors 5a and 5b are bonded on the flexible printed board 2 by a so-called flip chip bonding method. Note that the element formation surfaces 5a-1 and 5b-1 of the semiconductors 5a and 5b are arranged upside down toward the flexible printed board 2.

Light-shielding tapes 7a and 7b which are larger than the semiconductors 5a and 5b in outside dimension are adhered to the flexible printed board 2 on the sides opposite the sides on which the semiconductors 5a and 5b are located, respectively are mounted. The light-shielding tapes 7a and 7b shield the element surfaces of the semiconductors 5a and 5b from external light to be incident on the element surfaces. In this manner, external light being incident on the elements can be suppressed to a minimum.

In a general camera, a black box is formed in a portion for holding a film or an image pickup element to assure a light-shielding property. External light can easily enter into the interior part of the camera through the gap between the outer member 1 and the LCD window 3 arranged on the upper surface of the outer member 1. In particular, in the vicinity of the LDC window 3, electronic circuits including ICs are often arranged. Consequently, when such external light is incident on the surface of an IC element, such element can be greatly influenced thereby, and external light cannot be easily prevented from being incident on the portion.

Even if the outer member is completely airtightly closed, as described above, the electric circuit parts are exposed to external light during assembly or restoration of the camera.

The camera according to this embodiment is characterized in that, with the above arrangement, external light can be prevented from being incident on a semiconductor element as much as possible.

Figure 2:
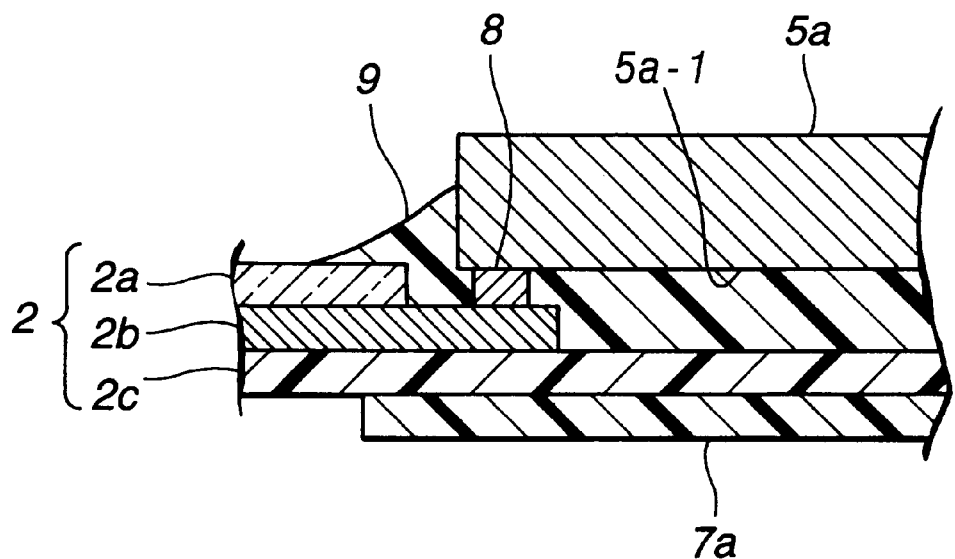
FIG. 2 is a sectional view showing a further detailed state of a main part of a semiconductor 5a as shown in FIG. 1 and serving as a typical one of the semiconductors 5a and 5b flip-chip-bonded on the flexible printed board according to the first embodiment.

FIG. 2 is a sectional view showing a further detailed state of a main part of a semiconductor 5a serving as a typical one of semiconductors 5a and 5b flip-chip-bonded on the flexible printed board 2.

The flexible printed board 2, as shown in FIG. 2, is constituted by a base material 2c, a cover layer 2a, and a copper pattern 2b. The copper pattern 2b is mounted on the base material 2c and covered with the cover layer 2a. More specifically, the copper pattern 2b is interposed between the cover layer 2a and the base material 2c.

The cover layer 2a and the base material 2c consist of an almost transparent material such as polyimide. Therefore, it can be regarded that the copper pattern 2b cannot be shielded from external light or internal light by the cover layer 2a and the base material 2c.

The semiconductor 5a is connected to the copper pattern 2b through a bump portion 8. More specifically, the bump portion 8 is arranged on an external electrode of the semiconductor 5a, so that a predetermined electrode of the semiconductor 5a is directly connected to the copper pattern 2b or is connected to the copper pattern 2b through conductive particles (not shown) or the like.

An adhesive 9 is filled in a very thin space formed around the bump portion 8 and between the semiconductor 5a and the base material 2c. The adhesive 9 adheres the flexible printed board 2 to the semiconductor 5a. The adhesive 9 may contain the above-described conductive particles.

In addition, the light-shielding tape 7a is adhered to the flexible printed board 2 on the side opposite the side joined to the semiconductor 5a. The light-shielding tape 7a is of size sufficient to cover the element formation surface of the semiconductor 5a.

In this manner, external light is prevented from being incident on the semiconductor 5a by the light-shielding property of the light-shielding tape 7a, and an advantage of easily preventing a change in performance, an erroneous operation, or the like caused by the photo-electric effect of an element on the semiconductor can be obtained.

The effect of the light-shielding tape 7a may also be obtained by printing or coating a light-shielding material at the position shown in FIG. 2.

When a coloring agent is mixed with the adhesive 9 to provide a light-shielding property to the adhesive 9, the same effect as described above can also be obtained.

A flexible printed board according to the second embodiment of the present invention of the present invention will be described below with reference to FIG. 3.

Figure 3:
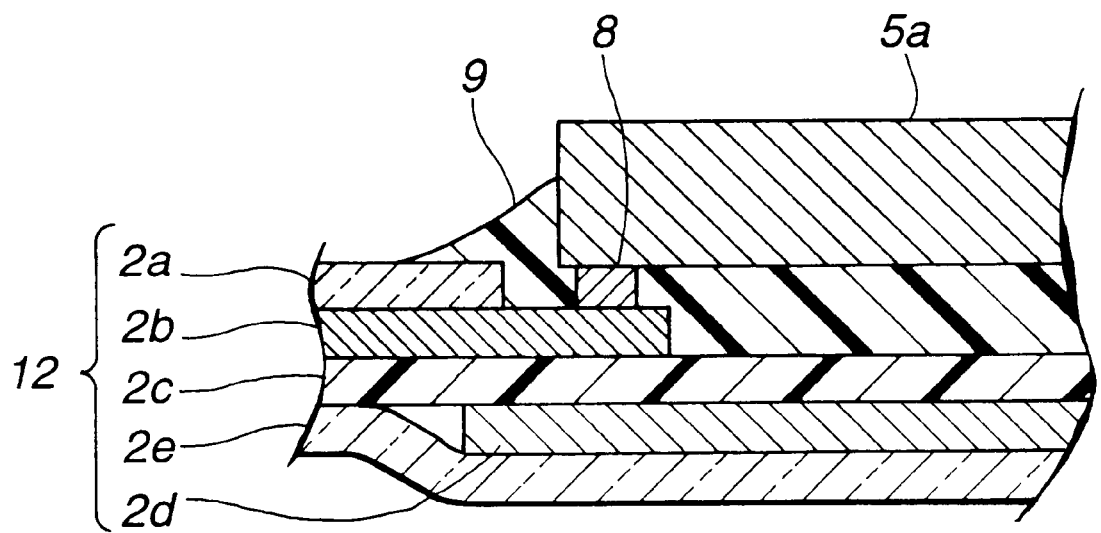
FIG. 3 is a sectional view showing a further detailed state of a main part of a semiconductor 5a serving as a typical one of the semiconductors 5a and 5b flip-chip-bonded on a flexible printed board according to the second embodiment of the present invention.

FIG. 3 is a sectional view showing a further detailed state of a main part of a semiconductor 5a serving as a typical one of the semiconductors 5a and 5b flip-chip-bonded on a flexible printed board according to the second embodiment of the present invention. The same reference numerals as in the first embodiment denote the same parts in the second embodiment.

The flexible printed board according to the second embodiment is obtained by increasing the number of layers of the flexible printed board 2 described above.

As shown in FIG. 3, a flexible printed board 12 according to this embodiment is constituted such that in addition to the cover layer 2a, the copper pattern 2b, and the base material 2c, a second copper pattern 2d is formed on the lower surface of the base material 2c, and a rear cover layer 2e is formed on the lower surface of the second copper pattern 2d.

In the first embodiment, the element formation surface of the semiconductor 5a is shielded from external light by the light-shielding tape 7a. However, in the second embodiment, the element formation surface is shielded from external light by the second copper pattern 2d.

In this embodiment, although the second copper pattern 2d is used for light shielding, the light shielding can also be performed by the first copper pattern 2b, a third or fourth copper pattern layer obtained by more increasing the number of layers, or a combination of these layers.

External light is also prevented from being incident on the semiconductor 5a by the flexible printed board according to the second embodiment, and an advantage of easily preventing a change in performance, an erroneous operation, or the like caused by the photo-electric effect of an element on the semiconductor can be obtained.

A flexible printed board according to the third embodiment of the present invention will be described below with reference to FIG. 4.

Figure 4:
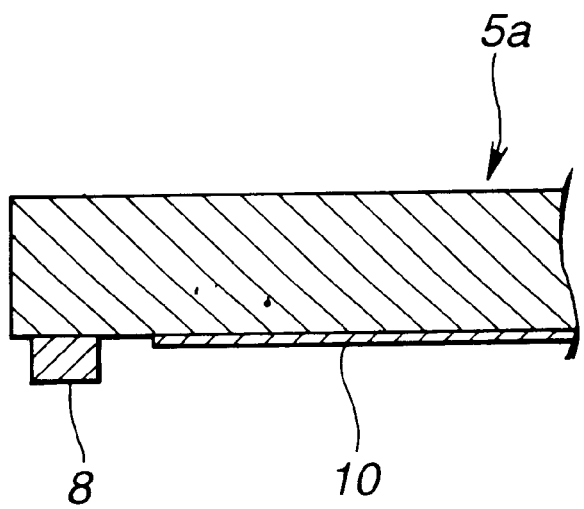
FIG. 4 is a sectional view showing a further detailed state of a main part of a semiconductor 5a serving as a typical one of the semiconductors 5a and 5b flip-chip-bonded on a flexible printed board according to a third embodiment of the present invention.

FIG. 4 is a sectional view showing a further detailed state of a main part of a semiconductor 5a serving as a typical one of the semiconductors 5a and 5b flip-chip-bonded on a flexible printed board according to the third embodiment of the present invention. The same reference numerals as in the first embodiment denote the same parts in the third embodiment.

The third embodiment is characterized in that an aluminum layer 10 for light shielding is formed on the element formation surface of the semiconductor 5a, and the same light-shielding property as that in the first or second embodiment is performed by the aluminum layer 10.

The aluminum layer 10 is one of a plurality of aluminum layers used for wiring between semiconductor elements. When the aluminum layer 10 is formed to cover an element having a photo-electric effect on the semiconductor 5a, an erroneous operation caused by incident light can be prevented. Light-shielding printing may be performed without using an aluminum wiring layer.

By the flexible printed board according to the third embodiment, external light is prevented from being incident on the semiconductor 5a. An advantage of easily preventing a change in performance, an erroneous operation, or the like caused by the photo-electric effect of the element on the semiconductor can be obtained.

As has been described above, according to the flexible printed board of each of the embodiments, even if a flexible printed board on which a semiconductor is flip-chip-bonded is used in a device such as a camera which is used out of doors or receives light, when the element formation surface of the semiconductor is shielded from light, external light or the like can be prevented from being incident on the semiconductor element surface. An advantage of easily preventing a change in performance, an erroneous operation, or the like caused by the photo-electric effect of the element on the semiconductor can be obtained.

In this invention, it is apparent that working modes different in a wide range can be formed on this basis of this invention without departing from the spirit and scope of the invention. This invention is not restricted by any specific embodiment except as may be limited by the appended claims.

What is claimed is:

1. A flexible printed board comprising:
   a semiconductor element having at least one surface which is an element formation surface, said element being flip-chip-bonded on said flexible printed board with the element formation surface facing the flexible printed board; and
   a light-shielding member arranged on said element formation surface of said semiconductor element.

2. A flexible printed board according to claim 1, wherein said flexible printed board and said semiconductor element are adhered to each other by said light shielding member, which is an adhesive having a light-shielding property.

3. A flexible printed board according to claim 1, wherein said light-shielding member is a light-shielding layer printed upon the element formation surface of said semiconductor element.

4. A flexible printed board comprising:
   a semiconductor element having at least one surface which is an element formation surface, said element being flip-chip-bonded on said flexible printed board with the element formation surface facing the flexible printed board, said flexible printed board lacking the ability to provide a good light shield due to its light transmissive properties; and
   an adhesive having a light-shielding property for adhering said semiconductor element to said flexible printed board.

5. A flexible printed board comprising:
   a semiconductor element having at least one surface which is an element formation surface, said element being flip-chip-bonded on said flexible printed board with the element formation surface facing the flexible printed board; and
   an adhesive having a light-shielding property for adhering said semiconductor element to said flexible printed board.

6. A flexible printed board comprising:
   a semiconductor element having at least one surface which in an element formation surface, said element being flip-chip-bonded on said flexible printed board with the element formation surface facing the flexible printed board; and
   a light-shielding member arranged on said flexible printed board substantially opposing said element formation surface of said semiconductor element.

7. A flexible printed board according to claim 6, wherein said light-shielding member is arranged on a flexible printed board surface opposite a flexible printed board surface on which said semiconductor element is flip-chip-bonded.

8. A flexible printed board according to claim 6, wherein said light-shielding member is a light-shielding tape arranged on a side opposite a flexible printed board on which said semiconductor element is flip-chip-bonded and at a position substantially opposing the element formation surface of said bonded semiconductor element to prevent light from impinging upon the element formation surface.

9. A flexible printed board according to claim 7, wherein said flexible printed board and said semiconductor element are adhered to each other by a second light shielding member, which is an adhesive having a light-shielding property.

10. A flexible printed board comprising:
    a semiconductor elememt having at least one surface which is an element formation surface, said element being flip-chip-bonded on said flexible printed board with the element formation surface facing the flexible printed board, said flexible printed board lacking the ability to provide a good light shield due to its light transmissive properties; and
    a light-shielding member arranged on said element formation surface of said semiconductor element.

11. A flexible board comprising:
    a semiconductor element having at least one surface which is an element formation surface, said element being flip-chip-bonded on said flexible printed board with the element formation surface facing the flexible printed board, said flexible printed board lacking the ability to provide a good light shield due to its light transmissive properties; and
    a light-shielding member arranged on said flexible printed board substantially opposing said element formation surface of said semiconductor element.

12. A flexible printed board comprising:
    a semiconductor element having at least one surface which is an element formation surface, said element being flip-chip-bonded on one surface of said flexible printed board with the element formation surface facing the flexible printed board; and
    a light shielding coating coated on an opposite side of said flexible printed beard and at a position opposing said element formation surface of said bonded semiconductor element.

13. A flexible printed board comprising:
    a semiconductor element having at least one surface which is an element formation surface, said element being flip-chip-bonded on said flexible printed board with the element formation surface facing the flexible printed board; and
    a light-shielding coating coated on the element formation surface between said semiconductor element and said flexible printed board.

14. A flexible printed board comprising:
    a semiconductor element having at least one surface which is an element formation surface, said element being flip-chip-bonded on one surface of said flexible printed board with the element formation surface facing the flexible printed board, said flexible printed board lacking the ability to provide a good light shield due to its light transmissive properties; and
    a light-shielding coating coated on a opposite surface of said flexible printed board and at a position opposing said element formation surface of said bonded semiconductor element.

15. A flexible printed board comprising:
    a semiconductor element having at least one surface which is an element formation surface, said element being flip-chip-bonded on a surface of said flexible printed board with the element formation surface facing the flexible printed board, said flexible printed board lacking the ability to provide a good light shield due to its light transmissive properties; and
    a light-shielding coating coated on the element formation surface between said semiconductor element and said flexible printed board.

16. A flexible printed board comprising:
    a semiconductor element having at least one surface which is an element formation surface, said element being flip-chip-bonded on one surface of said flexible printed board with the element formation surface facing the flexible printed board; and an aluminum wiring layer arranged on a surface of said semiconductor element on an element formation surface side, wherein said aluminum wiring layer shields said element formation surface of said semiconductor element from light to be incident on the element formation surface.

17. A flexible printed board comprising:

a semiconductor element having at least one surface which is an element formation surface, said element being flip-chip-bonded on said flexible printed board with the element formation surface facing the flexible printed board;

a first conductive pattern layer, formed in said flexible printed board, for connecting said semiconductor element; and a second conductive pattern layer formed in a layer different from said first conductive pattern layer in said flexible printed board and having at least a part arranged at a position corresponding to an element formation surface of said bonded semiconductor element, wherein said second conductive layer shields the element formation surface of said semiconductor element from light directed to be incident on the element formation surface.

18. A flexible printed board comprising:

a semiconductor element having at least one surface which is an element formation surface, said element being flip-chip-bonded on one surface of said flexible printed board with the element formation surface facing the flexible printed board, said flexible printed board lacking the ability to provide a good light shield due to its light transmissive properties; and an aluminum wiring layer arranged on a surface of said semiconductor element on an element formation surface side, wherein said aluminum wiring layer shields said element formation surface of said semiconductor element from light to be incident on the element formation surface.

19. A flexible printed board comprising:

a semiconductor element having at least one surface which is an element formation surface, said element being flip-chip-bonded on said flexible printed board with the element formation surface facing the flexible printed board, said flexible printed board lacking the ability to provide a good light shield due to its light transmissive properties;

a first conductive pattern layer, formed in said flexible printed board, for connecting said semiconductor element; and a second conductive pattern layer formed in a layer different from said first conductive pattern layer in said flexible printed board and having at least a part arranged at a position corresponding to said element formation surface of said bonded semiconductor element, wherein said second conductive layer shields the element formation surface of said semiconductor element from light directed to be incident on the element formation surface.

* * * * *